Figure 1:
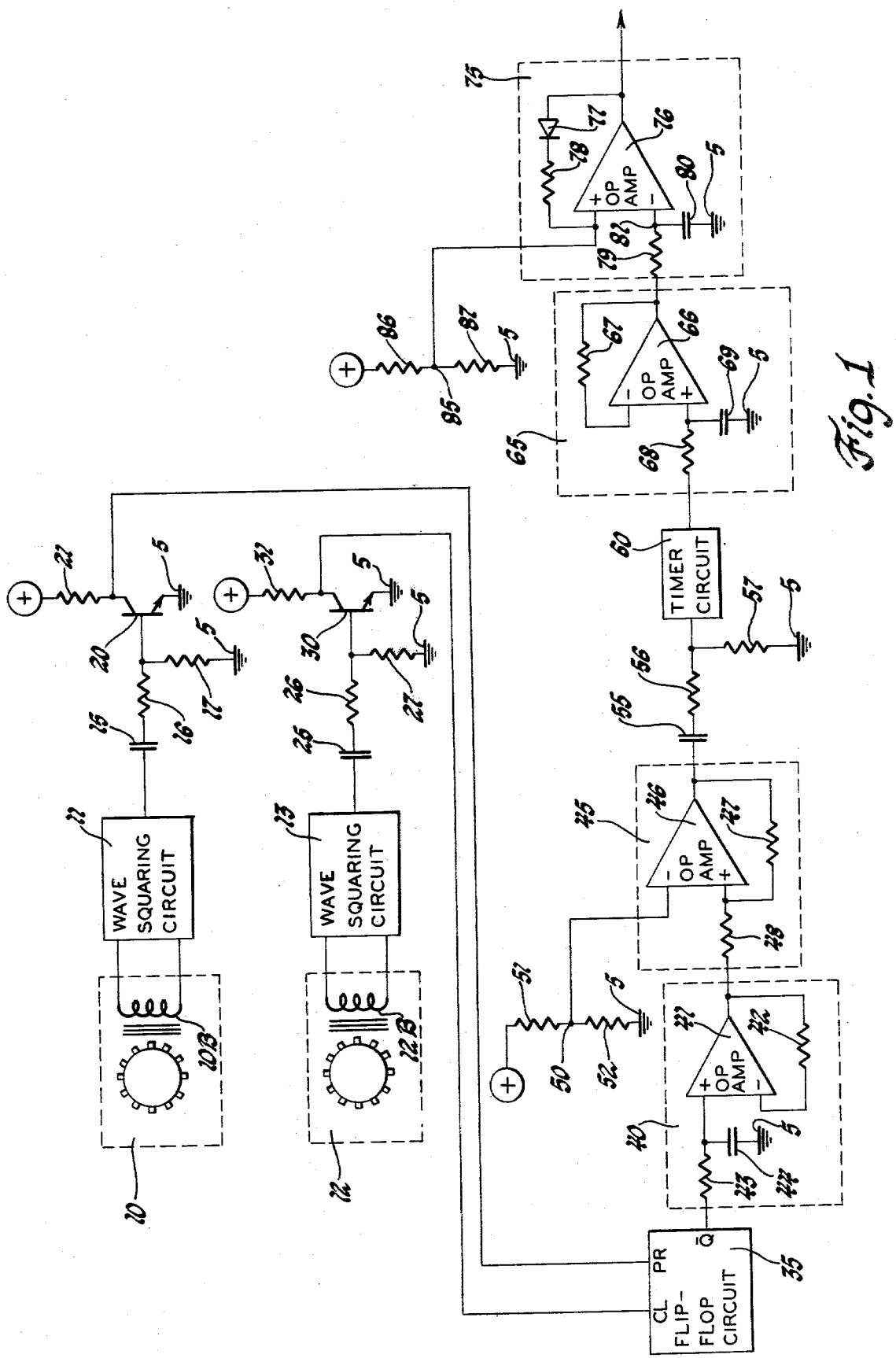

United States Patent [19]

Nelson

[11] 4,236,115
[45] Nov. 25, 1980

[54] SYNCHRONIZATION DETECTING AND INDICATING SYSTEM

[75] Inventor: Robert E. Nelson, Indianapolis, Ind.

[73] Assignee: General Motors Corporation, Detroit, Mich.

[21] Appl. No.: 959,343

[22] Filed: Nov. 9, 1978

[51] Int. Cl.³ .......................................... H03D 13/00
[52] U.S. Cl. .................................. 328/133; 328/127; 324/83 A; 307/232
[58] Field of Search ....................... 328/133, 134, 127; 307/232; 324/83 A

[56] References Cited

U.S. PATENT DOCUMENTS

| | | | |
|---|---|---|---|
| 3,211,993 | 10/1965 | Golden et al. | 324/83 A |
| 3,469,196 | 9/1969 | Cowin et al. | 328/133 |
| 3,588,699 | 6/1971 | Pysnik | 328/133 X |
| 3,588,710 | 6/1971 | Masters | 328/133 |
| 3,714,463 | 1/1973 | Laune | 307/232 |
| 3,755,745 | 8/1973 | Sapir | 328/133 |
| 3,798,556 | 3/1974 | Doya et al. | 328/133 |
| 3,866,133 | 2/1975 | Debloois et al. | 328/134 |
| 3,984,701 | 10/1976 | Pieper | 324/83 A |

Primary Examiner—John S. Heyman
Attorney, Agent, or Firm—Richard G. Stahr

[57] ABSTRACT

A two input flip-flop circuit is successively triggered to alternate states by two series of electrical signal pulses, each of which corresponds to one of two rotating members and is of a frequency proportional to the rotational speed of the corresponding rotating member. The flip-flop circuit output signals are applied to an averaging filter circuit that produces an output ramp signal that increases substantially linearly in amplitude as a function of change of phase displacement of the pulses of the two series of electrical signal pulses and remains at a constant value when the phase displacement of the pulses of the two series of electrical signal pulses remains constant thereby indicating an equality of the rotational speeds of the two rotating members.

4 Claims, 4 Drawing Figures

SYNCHRONIZATION DETECTING AND INDICATING SYSTEM

The invention herein described was made in the course of work under a contract or subcontract thereunder with the Department of Defense.

This invention is directed to a synchronization detecting and indicating system and, more specifically, to a system of this type that is sensitive to a constant phase displacement of the pulses of two series of electrical signal pulses of a frequency proportional to the rotational speed of respective rotating members.

There are many applications in which it is desirable to detect synchronization between two rotating members. For example, where it is required that two high speed rotating gears be meshed, it is extremely important that the synchronization be precise to avoid destruction of the gears upon the meshing operation. Prior art synchronization detecting systems, such as counting the revolutions of each of two rotating members for a selected period of time and comparing the resulting counts or the comparison of two direct current potential signals each of which is of a level proportional to the speed of a respective rotating member, may not provide sufficiently precise synchronization detection for successful high speed gear meshing. It has been found that a synchronization detecting and indicating system that is sensitive to a constant phase displacement of the pulses of a first and a second series of electrical signal pulses each of a frequency proportional to the rotational speed of a respective one of two rotating members provides a precise indication of synchronization between two high speed rotating members within a difference of one revolution per minute or less in rotational speed.

It is, therefore, an object of this invention to provide an improved synchronization detecting and indicating system.

It is another object of this invention to provide an improved synchronization detecting and indicating system that is sensitive to a constant phase displacement of the pulses of a series of electrical signal pulses of a frequency proportional to the rotational speed of one of two rotating members from the pulses of another series of electrical signal pulses of a frequency proportional to the rotational speed of the other one of the two rotating members.

It is an additional object of this invention to provide an improved synchronization detecting and indicating system that produces an output signal indication of the substantial equality of the rotational speeds of two rotating members when the phase displacement of the pulses of a series of electrical signal pulses of a frequency proportional to the rotational speed of one of the two rotating members and the pulses of another series of electrical signal pulses of a frequency proportional to the rotational speed of the other one of the two rotating members is constant.

In accordance with this invention, a synchronization detecting and indicating system for producing an output signal indication of the substantial equality of the rotational speeds of two rotating members is provided wherein the phase displacement of the pulses of two separate series of electrical signal pulses, each of a frequency proportional to the rotational speed of a corresponding rotating member, is continuously monitored and an output signal indication of the substantial equality of the rotational speeds of the two rotating members is produced when the phase displacement of the pulses of the two series of electrical signal pulses is constant.

Figure 2:
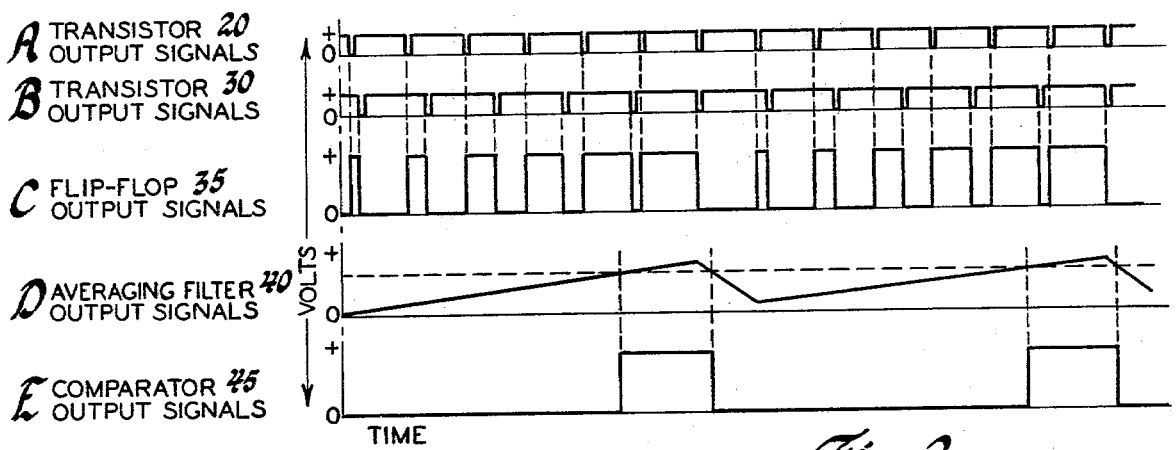
Figure 3:
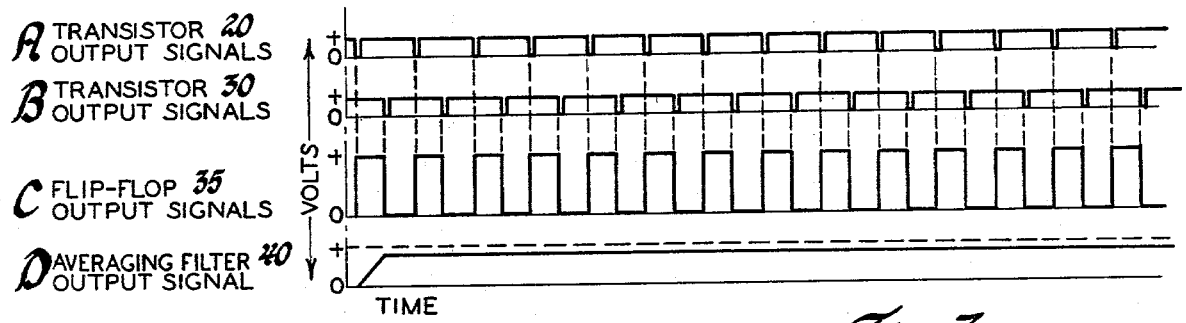
Figure 4:
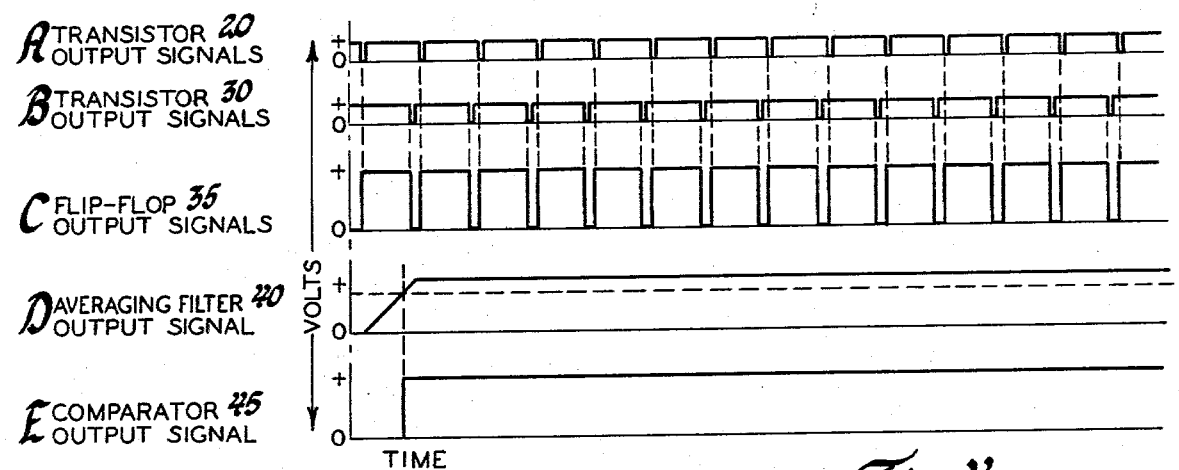

For a better understanding of the present invention, together with additional objects, advantages and features thereof, reference is made to the following description and accompanying drawing in which:

FIG. 1 sets forth the synchronization detecting and indicating system of this invention in schematic form; and FIGS. 2, 3 and 4 are respective sets of curves useful in understanding the system set forth in FIG. 1.

As point of reference or ground potential is the same point electrically throughout the system, it is represented in FIG. 1 by the accepted schematic symbol and referenced by the numeral 5.

In the interest of reducing drawing complexity, an operating potential source is not shown in FIG. 1 and specific operating potential connections are not shown for the several circuit elements set forth in block form. It is to be specifically understood, however, that any suitable source of direct current operating potential having the negative polarity output terminal thereof connected to point of reference or ground potential 5 and the positive polarity output terminal thereof connected to all of the points of the circuit of FIG. 1 indicated by a plus sign (+) within a circle may be employed and that rated operating potential is supplied to all of the circuit elements set forth in block form.

In FIG. 1, one conventional flip-flop circuit, four conventional operational amplifier circuits and one conventional timer circuit are illustrated in block form as, per se, these elements do not form a part of this invention. The flip-flop circuit may be a commercially available element such as that marketed by Texas Instruments Incorporated under the designation SN5472, the operational amplifier circuits may be commercially available elements such as those marketed by the National Semiconductor Corporation under the designation LM124 and the timer circuit may be a conventional commercially available monostable multivibrator circuit such as that marketed by Motorola Semiconductor Products, Inc. under the designation MC667 or a commercially available monolithic timing circuit such as that marketed by Motorola Semiconductor Products, Inc. under the designation MC1555. Two wave squaring circuits which, per se, form no part of this invention are also illustrated in block form in FIG. 1. These wave squaring circuits may be any of the many wave squaring circuits well known in the art such as a conventional monostable multivibrator circuit such as the MC667 marketed by Motorola Semiconductor Products, Inc., a conventional voltage comparator circuit such as the LM139 marketed by National Semiconductor Corporation or a conventional Schmitt trigger circuit such as the CD4093B marketed by RCA Corporation.

In accordance with logic terminology well known in the art, throughout this specification, logic signals will be referred to as "High" or logic 1 signals and "Low" or logic 0 signals. For purposes of this specification and without intention or inference of a limitation thereto the "High" or logic 1 signals will be considered to be of a positive polarity potential and the "Low" or logic 0 signals will be considered to be of zero or ground potential.

In an actual embodiment, the synchronization detecting and indicating system of this invention is employed to detect the equality of the rotational speeds of the input shaft and the output shaft of the high speed, high power clutch that is disclosed and described in detail in co-pending United States patent application Ser. No. 853,178, filed Nov. 21, 1977, Devlin et al, and is assigned to the same assignee as is this invention. In the actual embodiment, this clutch is employed to couple the output shaft of a gas turbine engine to an aircraft propeller. Briefly, in this clutch device, a hydraulically operated piston exerts a clamp-up pressure upon a first and a second plurality of stacked friction plates connected to respective clutch input and output members to effect rotation of the clutch output shaft in response to the rotation of the clutch input shaft until the rotational speed of the clutch output shaft is equal to the rotational speed of the clutch input shaft. Upon the attainment of this equality of rotational speeds or synchronization of the clutch input and output shafts, a splined coupling is hydraulically operated to positively straight through gear couple the clutch input and output shafts.

A first conventional magnetic pickup unit 10 is mounted in such a location that it produces a first series of electrical signal pulses of a frequency directly proportional to the rotational speed of a first rotating member that in the actual embodiment is the clutch input shaft. A second conventional magnetic pickup unit 12 is mounted in such a location that it produces a second series of electrical signal pulses of a frequency directly proportional to the rotational speed of a second rotating member that in the actual embodiment is the clutch output shaft. Magnetic pickup units 10 and 12 may be of the variable reluctance type well known in the art wherein a toothed wheel having a rotational speed equal to or a known proportion of the actual rotational speed of the corresponding rotating member is magnetically coupled to a pickup coil in which is induced a series of electrical signal pulses of a frequency directly proportional to the rotational speed of the corresponding rotating member. In the practice of this invention, it is necessary that magnetic pickup units 10 and 12 each produce the same number of pulses per revolution of the corresponding rotating member. In the actual embodiment, the rotating members to which magnetic pickup units 10 and 12 correspond are the clutch input shaft and the clutch output shaft, respectively. The substantially sine wave signal induced in pickup coil 10B of magnetic pickup unit 10 is converted into a series of square wave electrical signal pulses by wave squaring circuit 11 and the substantially sine wave signal induced in pickup coil 12B of magnetic pickup unit 12 is converted into a series of square wave electrical signal pulses by wave squaring circuit 13 in a manner well known in the art.

The wave squaring circuit 11 output series of electrical signal pulses are differentiated by the combination of capacitor 15 and resistors 16 and 17 into a series of positive going signal pulses that are applied to the base electrode of NPN transistor 20 in the proper polarity relationship to produce base-emitter drive current through an NPN transistor. As the collector electrode of NPN transistor 20 is connected to the positive polarity output terminal of the source of direct current operating potential through collector resistor 21 and the emitter electrode is connected to the negative polarity output terminal of the source of direct current operating potential through point of reference or ground potential 5, this device is triggered conductive through the collector-emitter electrodes upon the application of each positive going signal pulse to the base electrode thereof. NPN transistor 20, therefore, produces a series of negative going output signal pulses of a frequency proportional to the rotational speed of the clutch input shaft, as illustrated in FIGS. 2A, 3A and 4A.

The wave squaring circuit 13 output series of electrical signal pulses are differentiated by the combination of capacitor 25 and resistors 26 and 27 into a series of positive going signal pulses that are applied to the base electrode of NPN transistor 30 in the proper polarity relationship to produce base-emitter drive current through an NPN transistor. As the collector electrode of NPN transistor 30 is connected to the positive polarity output terminal of the source of direct current operating potential through collector resistor 31 and the emitter electrode is connected to the negative polarity output terminal of the source of direct current operating potential through point of reference or ground potential 5, this device is triggered conductive through the collector-emitter electrodes upon the application of each positive going signal pulse to the base electrode thereof. NPN transistor 30, therefore, produces a series of negative going output signal pulses of a frequency directly proportional to the rotational speed of the clutch output shaft, as illustrated in FIGS. 2B, 3B and 4B.

The two series of output signal pulses produced by respective NPN transistors 20 and 30 are applied to respective input terminals of conventional flip-flop circuit 35. In the actual embodiment in which a type SN5472 J-K flip-flop circuit is employed, the output signals of transistor 20 are applied to the "Preset" input terminal, the output signals of transistor 30 are applied to the "Clear" terminal and the output signals are taken from the $\overline{Q}$ output terminal. Upon the occurrence of each negative going output signal of transistor 20, flip-flop circuit 35 is triggered to the state in which a logic 1 output signal is present upon the $\overline{Q}$ output terminal thereof and in response to each negative going output signal of transistor 30 flip-flop circuit 35 is triggered to the condition to which a logic 0 signal is present upon the $\overline{Q}$ output terminal thereof. Flip-flop circuit 35, therefore, is responsive to the first and second series of electrical signal pulses for producing an output signal upon the occurrence of each signal pulse of the higher frequency one of the first and second series of electrical signal pulses and for terminating the output signal upon the occurrence of each signal pulse of the lower frequency one of the first and second series of electrical signal pulses. As a consequence, flip-flop circuit 35 produces a series of square wave output signal pulses that are of increasing width during the periods of time that there is a change of phase displacement of the pulses of the first and second series of electrical signal pulses and are of a constant width when there is no change of displacement between the pulses of the first and second series of electrical signal pulses. Referring to FIG. 2A, the output signal pulses of transistor 20 are of a higher frequency than the output signal pulses of transistor 30, consequently, there is a slow change of phase displacement of the pulses of the series of output signal pulses of transistor 20 from the pulses of the series of output signal pulses of transistor 30. As indicated by FIG. 2C, the output signal pulses of flip-flop circuit 35 are of an increasing width as the phase displacement of the pulses of these two series of electrical signal pulses increases until a point is reached at which a pulse of the higher frequency series of electrical signal pulses produced by transistor 20 passes through an in-phase relationship with a pulse of the lower frequency series of electrical signal pulse produced by transistor 30. After each of these transitions of phase displacement, the series of increasing width output signal pulses of flip-flop circuit 35 repeats. This repetition continues so long as there is a slow change of phase displacement of the pulses of these two series of electrical signal pulses and there is this slow change of phase displacement so long as the rotational speeds of the two rotating members are not equal. When the rotational speeds of the two rotating members are equal, there may be a phase displacement of the pulses of these two series of electrical signal pulses, however, the degree of phase displacement remains constant. As a consequence, the output signal pulses of flip-flop circuit 35 are of a constant width so long as the rotational speeds of the two rotating members are equal, as shown in FIGS. 3C and 4C that illustrate respective different constant phase displacements.

The series of output signal pulses of flip-flop circuit 35 are applied to a conventional averaging filter circuit 40 comprised of operational amplifier 41, feedback resistor 42, input resistor 43 and capacitor 44. Averaging filter circuit 40 is responsive to the series of square wave output signal pulses of flip-flop circuit 35 for producing an output signal that increases substantially linearly in amplitude as a function of the average of the series of square wave input signal pulses, as illustrated by the curve of FIG. 2D. During the period of time that a pulse of the higher frequency series of electrical signal pulses produced by transistor 20 passes through and moves out of an in-phase relationship with a pulse of the lower frequency series of electrical signal pulses produced by transistor 30, the output signal pulses of flip-flop circuit 35 are of a very short duration because this device is switched rapidly between its operating states during this transitional period. As a consequence, the average value of the output signal pulses of flip-flop 35 decreases in magnitude during this transition period. In response to this decrease of magnitude of the average of the flip-flop circuit 35 signal pulses, the output signal of averaging circuit 40 reduces to a lower amplitude. This ramp up and down of the output signal of averaging filter circuit 40 repeats at a frequency that is a function of the difference of the rotational speed of the first and second rotating members. Assuming for purposes of this specification that each transistor 20 and transistor 30 produce 60 output signal pulses per revolution of the corresponding rotating member, at a difference of one revolution per minute between the rotational speeds of the two rotating members, the repetition rate or frequency of the output ramp signal of averaging filter circuit 40 is one cycle per second, at a difference of two revolutions per minute, the repetition rate or frequency of this output ramp signal is two cycles per second and so on. This is because, at a difference of rotational speeds of the first and second rotating members of one revolution per minute at sixty pulses per revolution, a pulse of the higher frequency series of electrical signal pulses passes through an in-phase relationship with a pulse of the lower frequency series of electrical signal pulses every second and at a difference of rotational speeds of the first and second rotational members of two revolutions per minute at sixty pulses per revolution, a pulse of the higher frequency series of electrical signal pulses passes through an in-phase relationship with a pulse of a lower frequency series of electrical signal pulses twice every second and so on. It is obvious that with different numbers of pulses per revolution, this repetition rate or frequency will vary.

The output signal of averaging filter circuit 40 is applied to a conventional voltage comparator circuit 45 comprising a conventional operational amplifier circuit 46 having a feedback resistor 47 and an input resistor 48 connected between the output terminal of operational amplifier 41 of averaging filter circuit 40 and the non-inverting input terminal of operational amplifier circuit 46. A reference potential signal is applied to the inverting input terminal of operational amplifier circuit 46 from junction 50 between series resistors 51 and 52 connected across the positive polarity output terminal of the source of direct current operating potential and point of reference or ground potential 5. The reference potential signal appearing upon junction 50 is equal to the potential drop across resistor 52, is of a positive polarity upon junction 50 with respect to point of reference or ground potential 5 and establishes the trigger level for operational amplifier circuit 46. This reference signal is selected to be of a potential level less than the maximum potential level to which the output signal of averaging filter circuit 40 ramps up to during periods of a slow change of phase displacement of the pulses of the first and second series of electrical signal pulses, as indicated in FIG. 2D. With a potential signal applied to the non-inverting input terminal of a level less than that of the reference signal applied to the inverting input terminal, operational amplifier circuit 46 produces a logic 0 output signal. When the output signal of averaging filter circuit 40 ramps up to a potential level at least equal to that of the reference signal, operational amplifier circuit 46 is triggered to the state in which a logic 1 signal is present upon the output terminal thereof, as indicated by curves 2E and 4E. When the potential level of the signal applied to the non-inverting input terminal of operational amplifier circuit 46 reduces to a potential level less than that of the reference signal, this device is triggered to the state in which a logic 0 signal is present upon the output terminal thereof, as is indicated in curve 2E. Should the signal applied to the non-inverting input terminal of operational amplifier circuit 46 not reduce to a potential less than the trigger level, the output signal of operational amplifier circuit 51 remains at the logic 1 level, as indicated by curve 4E. Should the signal applied to the non-inverting input terminal of operational amplifier circuit 46 not rise to the trigger level, the output signal of operational amplifier circuit 46 is a logic 0.

The positive going excursion of each logic 1 output signal of operational amplifier circuit 46 is differentiated into a positive going signal pulse by the combination of capacitor 55 and resistors 56 and 57 that is applied to the input terminal of timer circuit 60. Timer circuit 60 may be a well known logic circuit element of the type that is triggered by a positive going input signal pulse to an alternate state in which a logic 1 signal appears upon the output terminal thereof and remains in this alternate state for a predetermined period of time as determined by the timing circuit network associated therewith, as is well known in the art. In the actual embodiment, timer circuit 60 is a type 555 timer marketed by Motorola Semiconductor Products, Inc. After this timer circuit element has timed out, it spontaneously reverts to the initial stable state in which a logic 0 signal is present upon the output terminal. Timer circuit 60, therefore, is triggered to the alternate state each time the ramp signal produced by averaging filter circuit 40 increases in amplitude to a potential level at least equal to the trigger level of operational amplifier circuit 46 of voltage comparator circuit 45 and produces a series of square wave output signal pulses of a constant width so long as there is a slowly changing phase displacement of the pulses of the series of electrical pulses produced by transistor 20 and the pulses of the series of electrical pulses produced by transistor 30 at a frequency that is a function of the difference of rotational speeds of the two rotating elements. As has been previously brought out, timer circuit 60 may be a conventional monostable multivibrator circuit.

The series of square wave constant width output signal pulses produced by timer circuit 60 is applied to another averaging filter circuit 65 consisting of conventional operational amplifier circuit 66 having a feedback resistor 67 and an input resistor 68 and a capacitor 69.

Averaging filter circuit 65 produces an output signal which ramps up to a direct current potential level that is an average of the input signals from timer circuit 60. As a consequence, so long as timer circuit 60 produces a series of constant width square wave output signals, averaging filter circuit 65 produces an output signal of a direct current potential level equal to the average of the input signals.

The output signals of averaging filter circuit 65 are applied to another conventional voltage comparator circuit 75 comprising a conventional operational amplifier circuit 76 having a feedback circuit including series diode 77 and resistor 78 and an input resistor 79 connected between the output terminal of timer circuit 60 and the non-inverting input terminal of operational amplifier circuit 76. A reference potential signal is applied to the non-inverting input terminal of operational amplifier circuit 76 from junction 85 between series resistors 86 and 87 connected across the positive polarity output terminal of the source of supply potential and point of reference or ground potential 5. The reference signal appearing upon junction 85 is equal to the potential drop across resistor 87, is of a positive polarity upon junction 85 with respect to point of reference or ground potential 5 and establishes the trigger level for operational amplifier circuit 76. As the feedback circuit is connected from the output terminal to the non-inverting input terminal of operational amplifier circuit 76 and the non-inverting input terminal thereof is connected to junction 85 between resistors 86 and 87, diode 77 is included in this feedback circuit to prevent the voltage signal present upon junction 85 from appearing upon the output terminal of operational amplifier circuit 76. The output signal of averaging filter circuit 65 is delayed by conventional delay circuit network comprising input resistor 79 and capacitor 80. As a result of this delay circuit network, the potential signal appearing upon junction 81 increases and decreases with and at a later time than the output signal of averaging filter circuit 65 as determined by the time constant of the resistor 79 and capacitor 80 combination. Therefore, any decrease of the potential level of the output signal of averaging filter circuit 65 is accompanied by a corresponding decrease of potential level upon junction 81 at a later time. Because, as the rotational speeds of the two rotating members approach synchronism or equality, the frequency of the ramp signal produced by averaging filter circuit 40 decreases, timer circuit 60 is triggered to the state in which a logic 1 signal is present upon the output terminal thereof at a slower rate. Because timer circuit 60 is triggered to the alternate state at a slower rate as the rotational speeds of the two rotating members approach synchronism or equality the average of the output signals thereof produced by averaging filter circuit 65 reduces in potential magnitude. The reason for the delay circuit network is to provide a slight delay from the time the output signal of averaging filter circuit 65 reduces below the trigger level of operational amplifier circuit 76 to insure that there is a valid indication of substantial synchronization of the rotational speeds of the two rotating elements. When the potential level of this delayed signal appearing upon junction 81 decreases to a potential level below that of the reference signal applied to the non-inverting input terminal of operational amplifier circuit 76 as the rotational speeds of the two rotating members approach equality, this device switches to the state in which a logic 1 signal appears upon the output terminal thereof which is an output signal indication of substantial equality or synchronization of the rotational speeds of the two rotating members.

While a preferred embodiment of the present invention has been shown and described, it will be obvious to those skilled in the art that various modifications and substitutions may be made without departing from the spirit of the invention which is to be limited only within the scope of the appended claims.

The embodiments of the invention in which an exclusive property or privilege is claimed are defined as follows:

1. A synchronization detecting and indicating system for producing an output signal indication of the substantial equality of the rotational speeds of two rotating members, comprising:

first means for producing a first series of electrical signal pulses of a frequency directly proportional to the rotational speed of one of said two rotating members;

second means for producing a second series of electrical signal pulses of a frequency directly proportional to the rotational speed of the other one of said two rotating members, each of said first and second means producing the same number of electrical signal pulses per revolution of the corresponding said rotating member;

means responsive to said first and second series of electrical signal pulses for producing an output signal upon the occurrence of each signal pulse of the higher frequency one of said first and second series of electrical signal pulses and for terminating said output signal upon the occurrence of each signal pulse of the lower frequency one of said first and second series of electrical signal pulses whereby said means produces a series of square wave output signal pulses that are of increasing width during the periods of time that there is a change of phase displacement of the pulses of said first and second series of electrical signal pulses and that are of constant width when there is no change of phase displacement of the pulses of said first and second series of electrical signal pulses;

means responsive to said series of square wave output signal pulses for producing an output signal that increases substantially linearly in amplitude as a function of the average of said series of square wave output signal pulses and reduces to a lower amplitude during the period of time that a pulse of the higher frequency one of said first and second series of electrical signal pulses passes through an in-phase relationship with a pulse of the lower frequency one of said first and second series of electrical signal pulses, that repeats at a frequency that is a function of the difference of the rotational speeds of said first and second rotating members and remains at a constant value when the phase displacement of the pulses of said first and second series of electrical signal pulses remains constant;

means for converting said output signals of said last named means into an electrical signal of a potential level that increases and decreases with increasing and decreasing differences of rotational speeds of said rotating members, whereby the potential level of said electrical signal decreases as the rotational speeds of said rotating members approaches equality; and means responsive to a decrease of potential level of said electrical signal to a preselected potential level for producing an output signal indication of a substantial equality of the rotational speed of said rotating members.

2. A synchronization detecting and indicating system for producing an output signal indication of the substantial equality of the rotational speeds of two rotating members, comprising:

first means for producing a first series of electrical signal pulses of a frequency directly proportional to the rotational speed of one of said two rotating members;

second means for producing a second series of electrical signal pulses of a frequency directly proportional to the rotational speed of the other one of said two rotating members, each of said first and second means producing the same number of electrical signal pulses per revolution of the corresponding said rotating member;

means responsive to said first and second series of electrical signal pulses for producing an output signal upon the occurrence of each signal pulse of the higher frequency one of said first and second series of electrical signal pulses and for terminating said output signal upon the occurrence of each signal pulse of the lower frequency one of said first and second series of electrical signal pulses whereby said means produces a series of square wave output signal pulses that are of increasing width during the periods of time that there is a change of phase displacement of the pulses of said first and second series of electrical signal pulses and that are of constant width when there is no change of phase displacement of the pulses of said first and second series of electrical signal pulses; and means responsive to said series of square wave output signal pulses for producing an output signal that increases substantially linearly in amplitude as a function of the average of said series of square wave output signal pulses and reduces to a lower amplitude during the period of time that a pulse of the higher frequency one of said first and second series of electrical signal pulses passes through an in-phase relationship with a pulse of the lower frequency one of said first and second series of electrical signal pulses, that repeats at a frequency that is a function of the difference of the rotational speeds of said first and second rotating members and remains at a constant value when the phase displacement of the pulses of said first and second series of electrical signal pulses remains constant;

means for converting said output signals of said last named means into a first electrical signal of a potential level that increases and decreases with increasing and decreasing differences of rotational speeds of said rotating members, whereby the potential level of said first electrical signal decreases as the rotational speeds of said rotating members approach equality;

means for converting said first electrical signal into a second electrical signal of a potential level that increases and decreases with and at a selected later time than said first electrical signal whereby any decrease of potential level of said first electrical signal as the rotational speeds of said rotating members approach equality is accompanied by a corresponding decrease of potential level of said second electrical signal at a later time; and means responsive to a decrease of potential level of said second electrical signal to a preselected potential level for producing an output signal indication of a substantial equality of the rotational speeds of said rotating members.

3. A synchronization detecting and indicating system for producing an output signal indication of the substantial equality of the rotational speeds of two rotating members, comprising:

first means for producing a first series of electrical signal pulses of a frequency directly proportional to the rotational speed of one of said two rotating members;

second means for producing a second series of electrical signal pulses of a frequency directly proportional to the rotational speed of the other one of said two rotating members, each of said first and second means producing the same number of electrical signal pulses per revolution of the corresponding said rotating member;

means responsive to said first and second series of electrical signal pulses for producing an output signal upon the occurrence of each signal pulse of the higher frequency one of said first and second series of electrical signal pulses and for terminating said output signal upon the occurrence of each signal pulse of the lower frequency one of said first and second series of electrical signal pulses whereby said means produces a series of square wave output signal pulses that are of increasing width during the periods of time that there is a change of phase displacement of the pulses of said first and second series of electrical signal pulses and that are of constant width when there is no change of phase displacement of the pulses of said first and second series of electrical signal pulses; and a first averaging filter circuit responsive to said series of square wave output signal pulses for producing an output signal that increases substantially linearly in amplitude as a function of the average of said series of square wave output signal pulses and reduces to a lower amplitude during the period of time that a pulse of a higher frequency one of said first and second series of electrical signal pulses passes through an in-phase relationship with a pulse of the lower frequency one of said first and second series of electrical signal pulses, that repeats at a frequency that is a function of the difference of the rotational speeds of said first and second rotating members and remains at a constant value when the phase displacement of the pulses of said first and second series of electrical signal pulses remains constant;

means including a first voltage comparator circuit, a monostable multivibrator circuit and a second averaging filter circuit for converting said output signals of said first averaging filter circuit into an electrical signal of a potential level that increases and decreases with increasing and decreasing differences of rotational speeds of said rotating members, whereby the potential level of said electrical signal decreases as the rotational speeds of said rotating members approaches equality; and a second voltage comparator circuit responsive to a decrease of potential level of said electrical signal to a preselected potential level for producing an output signal indication of a substantial equality of the rotational speed of said rotating members.

4. A synchronization detecting and indicating system for producing an output signal indication of the substantial equality of the rotational speeds of two rotating members comprising:

first means for producing a first series of electrical signal pulses of a frequency directly proportional to the rotational speed of one of said two rotating members;

second means for producing a second series of electrical signal pulses of a frequency directly proportional to the rotational speed of the other one of said two rotating members, each of said first and second means producing the same number of electrical signal pulses per revolution of the corresponding said rotating member;

means responsive to said first and second series of electrical signal pulses for producing an output signal upon the occurrence of each signal pulse of the higher frequency one of said first and second series of electrical signal pulses and for terminating said output signal upon the occurrence of each signal pulse of the lower frequency one of said first and second series of electrical signal pulses whereby said means produces a series of square wave output signal pulses that are of increasing width during the periods of time that there is a change of phase displacement of the pulses of said first and second series of electrical signal pulses and that are of constant width when there is no change of phase displacement of the pulses of said first and second series of electrical signal pulses; and a first averaging filter circuit responsive to said series of square wave output signal pulses for producing an output signal that increases substantially linearly in amplitude as a function of the average of said series of square wave output signal pulses and reduces to a lower amplitude during the period of time that a pulse of the higher frequency one of said first and second series of electrical signal pulses passes through an in-phase relationship with a pulse of the lower frequency one of said first and second series of electrical signal pulses, that repeats at a frequency that is a function of the difference of the rotational speeds of said first and second rotating members and remains at a constant value when the phase displacement of the pulses of said first and second series of electrical signal pulses remains constant;

means including a first voltage comparator circuit, a monostable multivibrator circuit and a second averaging filter circuit for converting said output signals of said first averaging filter circuit into a first electrical signal of a potential level that increases and decreases with increasing and decreasing differences of rotational speeds of said rotating members, whereby the potential level of said electrical signal decreases as the rotational speeds of said rotating members approaches equality;

means including a resistance-capacitance time constant circuit for converting said first electrical signal into a second electrical signal of a potential level that increases and decreases with and at a selected later time than said first electrical signal whereby any decrease of potential level of said first electrical signal, as the rotational speeds of said rotating members approach equality is accompanied by a corresponding slower decrease of potential level of said second electrical signal at a later time; and a second voltage comparator circuit responsive to a decrease of potential level of said second electrical signal to a preselected potential level for producing an output signal indication of a substantial equality of the rotational speeds of said rotating members.

* * * * *